United States Patent
Heigl

Patent Number: 5,845,789
Date of Patent: Dec. 8, 1998

[54] DEVICE FOR HOLDING AT LEAST ONE HOLDING TRAY FOR ELECTRONIC COMPONENTS

[76] Inventor: Helmuth Heigl, Anemonenstrasse 3a, 83059 Kolbermoor, Germany

[21] Appl. No.: 621,159

[22] Filed: Mar. 22, 1996

[30] Foreign Application Priority Data

Mar. 28, 1995 [DE] Germany ........................ 195 11 365.9

[51] Int. Cl.⁶ ........................................ A47F 7/00
[52] U.S. Cl. ............................................................. 211/26
[58] Field of Search ................................ 211/26; 361/679, 361/683, 724, 796; 248/DIG. 9, 27.1

[56] References Cited

U.S. PATENT DOCUMENTS

| | | | |
|---|---|---|---|
| 3,606,019 | 9/1971 | Dubiel | 211/26 |
| 4,079,838 | 3/1978 | Granum | 211/26 |
| 5,626,406 | 5/1997 | Schmid | 211/26 X |

FOREIGN PATENT DOCUMENTS

| | | |
|---|---|---|
| 89 14 995 U | 5/1990 | Germany . |
| 6-278805 | 10/1994 | Japan . |

*Primary Examiner*—Alvin C. Chin-Shue
*Assistant Examiner*—Sarah Purol
*Attorney, Agent, or Firm*—Herbert L. Lerner; Laurence A. Greenburg

[57] ABSTRACT

Holding trays for electronic components have different dimensions, depending upon the manufacturer, and are, thus, non-standardized. The invention is a device for holding trays of this kind, which has a tray-shaped carrying element. The carrying element includes a holding region for at least one holding tray, which has variable dimensions for adapting to the dimensions of the at least one holding tray. The carrying element also has a rectangular-shaped edge region with outer surfaces. Guide elements are provided on the outer surfaces of the rectangular edge region. In one embodiment according to the invention, the guide elements are grooves with toothed rack profiles on an end of the grooves. Guide devices such as a pinion, groove block or roller engage in the toothed rack profiles to guide and transport the device. In another embodiment according to the invention, the holding region includes locking pins (71, 7*b*) disposed in a contact surface of the holding region, which displace to the dimensions of the at least one holding tray.

22 Claims, 3 Drawing Sheets

DEVICE FOR HOLDING AT LEAST ONE HOLDING TRAY FOR ELECTRONIC COMPONENTS

BACKGROUND OF THE INVENTION

FIELD OF THE INVENTION

The invention relates to a device for holding at least one holding tray for electronic components, and in particular a non-standardized holding tray.

In the production, testing and sorting of electronic components such as chips, for example, tray-like holding magazines are used for holding the components. The term "tray", borrowed from the English language, is customary in the trade for describing magazines of this kind.

After electronic components are manufactured, they are checked, either by the manufacturer or the consumer, for electronic and mechanical operability before use in a device. The electrical functions of the electronic components are tested under various conditions and the mechanical parameters, such as dimensional accuracy and co-planarity of the connecting contacts (pins), are established. In the process, the electronic components are handled in transport or holding trays which often vary from company to company and which may differ in shape, type, size and material.

For the purpose of testing, the electronic components are transferred from the holding tray into another tray which is adapted, in its dimensions, to the requirements of the testing device and may optionally be standardized. After the electronic components have been tested, they are once again transferred out of the tray adapted to the testing device and into the original, or some other, holding tray. This repeated transfer of the electronic components into the various trays carries the risk of mechanical damage, particularly to the delicate connecting contacts (pins).

SUMMARY OF THE INVENTION

It is accordingly an object of the invention to provide a device for holding at least one holding tray for electronic components, which overcomes the hereinafore-mentioned disadvantages of the heretofore-known methods and devices of this general type and which reduces the risk of damage to electronic components, particularly to their connecting contacts, by repeated transfer of the components.

With the foregoing and other objects in view there is provided, in accordance with the invention, a device for holding at least one holding tray for electronic components, comprising: a tray-shaped carrying element, the carrying element including a holding region for at least one holding tray, the holding region having variable dimensions to be adapted to dimensions of the at least one holding tray, and the carrying element including a rectangular-shaped edge region having outer surfaces with guide elements. Thus, when use is made of the device according to the invention, the transfer of the electronic components from the holding tray used at the manufacturer's end and into a tray adapted to the testing configuration, and the transfer back into the manufacturer's holding tray after testing, are eliminated. The electronic components therefore remain directly in the manufacturer's holding tray, are inserted, together with the latter, in the device according to the invention and are conveyed through the testing unit. Not only does this eliminate the transfer of the electronic components, which is linked with the risk of damage, but it is also no longer necessary to make available various devices, which are adapted to the testing unit, for different types of components.

The adaptable holding region of the device according to the invention, holds any holding tray, the outer dimensions of which are the same size as, or smaller than, the dimensions of the holding region of the device according to the invention. As a result, the expenditure involved in adjusting testing units or machines to operate with different types of components is minimized.

In accordance with an added feature of the invention, the holding region of the carrying element holds at least one non-standardized holding tray. The device according to the invention is, therefore, suitable for holding various manufacturers' holding trays with different dimensions, since the holding region of the device can be adapted to the non-standardized outer dimensions of various holding trays.

In accordance with an additional feature of the invention, the holding region includes a contact surface and locking pins disposed in the contact surface for displacement to the dimensions of the at least one holding tray. As a result, the holding region can be adapted particularly easily and rapidly to the outer dimensions of non-standardized holding trays which are to be held.

In accordance with another feature of the invention, the locking pins are advantageously disposed for displacement in the longitudinal and in the transverse direction of the holding region.

In accordance with a further feature of the invention, the locking pins lock in a position. As a result, infinitely variable adaptation of the holding region to holding trays which are to be inserted, can be carried out.

In accordance with again an added feature of the invention, the the locking pins snap-in a locked position or are spring-loaded to lock in a position.

In accordance with again an additional feature of the invention, the edge region has inner sides with recesses formed therein.

In accordance with again another feature of the invention, the locking pins displace in the recesses for complete displacement from the holding region. Maximum use may, therefore, be made of the holding region defined by the rectangular edge region.

In accordance with again a further feature of the invention, the device includes gripping elements disposed in the recesses for gripping underneath the at least one tray inserted in the holding region. As a result, deposited trays can be conveniently and easily removed again from the device according to the invention. Furthermore, a refinement of this kind also enables the insertion and removal of the tray to be automated to the highest degree.

In accordance with yet an added feature of the invention, a vertical adjustment device is disposed in the holding region for vertically adjusting the at least one holding tray in the carrying element. Therefore, an identical reference plane can be provided when the carrying heights of the holding trays differ.

In accordance with yet an additional feature of the invention, the contact surface of the holding region has at least one depression or opening formed therein. As a result, a tray deposited in the device according to the invention can be gripped underneath, not only in the regions of the recesses provided in the rectangular edge region, but also in the region of the contact surface of the holding region. In a refinement of the contact surface involving one or more openings, a tray deposited in the holding region can also be removed by lifting it, for example through the use of a push rod, out of the device according to the invention.

In accordance with yet another feature of the invention, guide devices engage in the guide elements on the carrying element. The guide devices may be groove blocks, rollers or pinions.

In accordance with yet a further feature of the invention, the guide elements are grooves on the outer surfaces of the edge region. Guidance of the device in these grooves is possible through guide devices such as groove blocks or strip-like guide strips. It is also possible for a stacking gripper to engage in the the grooves, as a result of which the stackability of the device according to the invention is improved.

In accordance with still an added feature of the invention, the grooves on the outer surfaces are formed around the periphery of the edge region.

In accordance with still an additional feature of the invention, the end surfaces of the grooves are constructed as toothed rack profiles. As a result, the device according to the invention can be guided and transported by pinions engaging in the toothed rack profiles of the grooves.

In accordance with still another feature of the invention, the guide devices are driven by conveyer belts or conveyer chains to guide and transport the tray-shaped carrying element.

In accordance with still a further feature of the invention, the tray-shaped carrying element is made from a plastic material, which can be injected in an inherently stable manner. The tray-shaped carrying element may also be made from a light metal, in particular aluminum, which can be machined by cutting and hard-anodised.

Other features which are considered as characteristic for the invention are set forth in the appended claims.

Although the invention is illustrated and described herein as holding a holding tray for electronic components, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the preferred embodiments when read in connection with the accompanying drawings.

DESCRIPTION OF THE PREFERRED EMBODIMENTS

Figure 1:
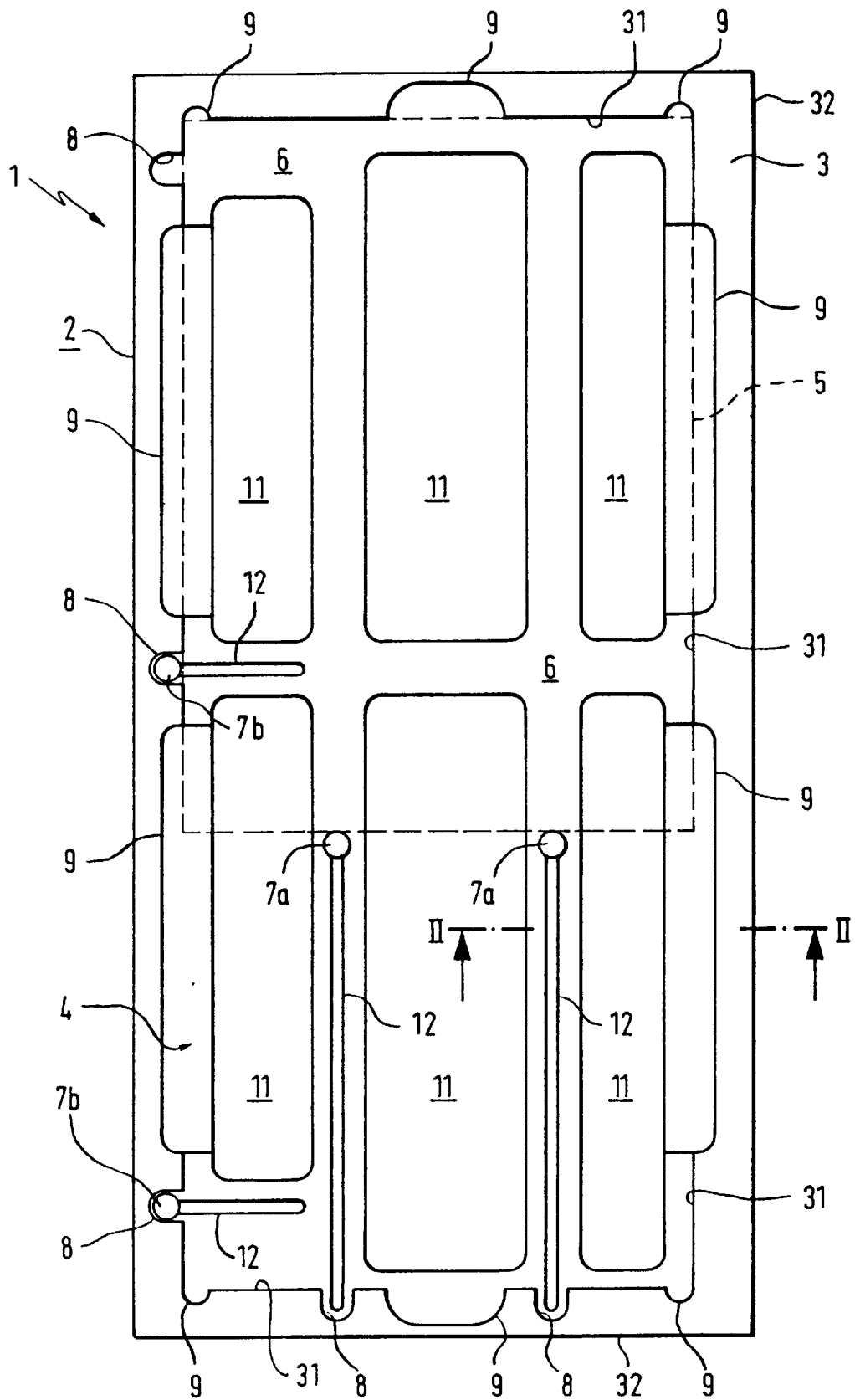
FIG. 1 is a diagrammatic, plan view of a device according to the invention for holding a holding tray.

Referring now to the figures of the drawings in detail and first, particularly, to FIG. 1 thereof, there is seen a device 1 according to the invention for holding holding trays 5 for electronic components. The device 1 includes a tray-shaped carrying element 2, which is essentially rectangular in shape and has a peripheral edge region 3. According to the invention, the edge region 3 is standardized in the sense that it has predetermined and defined outer dimensions.

A holding region 4, which is recessed from the edge region 3, is defined by the edge region 3 in the interior of the device 1. The edge region 3 has inner sides 31 due to the holding region 4. The holding region 4 has a contact surface 6 which is provided with a number of openings 11. The openings 11 may be depressions in the contact surface 6 rather than openings. In the exemplified embodiment represented, six elongated, essentially rectangular openings 11 with rounded corners are provided. However, it is also possible to provide a different number of openings and/or openings of a different shape.

Guides 12 extending both in the longitudinal and in the transverse direction of the holding region 4 are also provided in the contact surface 6. Locking pins 7a and 7b are displaceably inserted in the guides 12. The guides 12 extend through an inner side 31 of the edge region 3 and end in recesses 8 provided at that point. Under these circumstances, the size of the recesses 8 is selected in such a way that a locking pin 7 can be held therein.

Also provided on the inner sides 31 of the rectangular edge region 3 are recesses 9 of different sizes, which also extend into the contact surface 6 of the holding region 4.

Figure 2A:
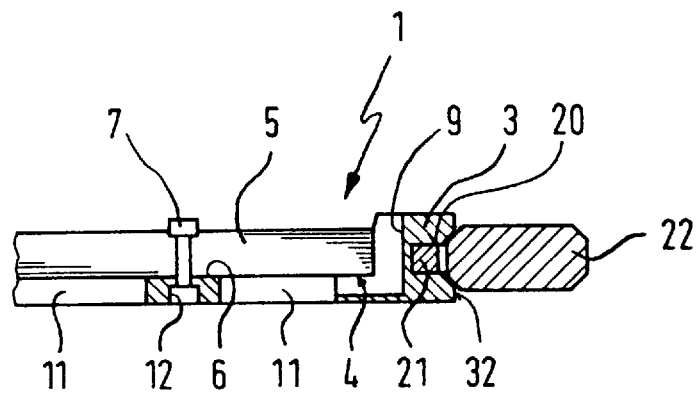
FIG. 2a is a fractional, cross-sectional view of an embodiment of the device with a groove block engaging in a guide groove, which is taken along the line II—II of FIG. 1 in the direction of the arrows.
Figure 2B:
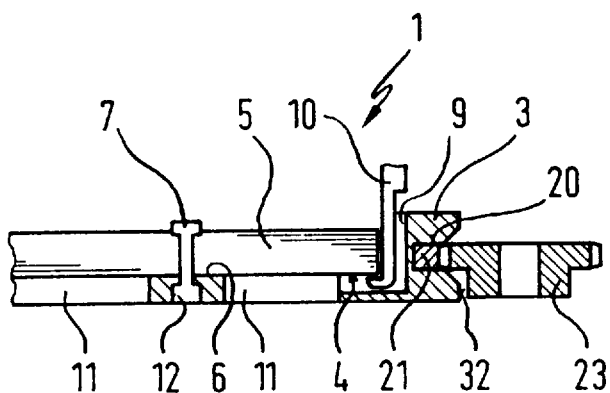
FIG. 2b is a fractional, cross-sectional view of another embodiment of the device with a groove having a toothed rack profile and with a pinion engaging the groove, which is taken along the line II—II of FIG. 1 in the direction of the arrows.

FIGS. 2a and 2b are fractional, cross-sectional views of two different embodiments of the device according to the invention in the region of a recess 9, which is taken along the line II—II of FIG. 1 in the direction of the arrows FIG. 2a shows a fractional, cross-sectional view of the device according to the invention with an edge region 3 and a holding region 4, which is defined by the edge region 3 and is recessed from the edge region 3. On an inner side 31 of the edge region 3 there is provided a recess 9 which extends into the holding region 4 so that a tray 5 deposited in the holding region 4 does not make contact in the region of the recess 9. A contact surface 6 of the holding region 4 is provided with openings 11. A guide 12, in which a locking pin 7a is displaceably inserted, can also be seen in the sectional representation in FIG. 2a.

A groove 20 is constructed on a lateral outer surface 32 of the edge region 3. The groove 20 has a broader cross-section proximal to the lateral outer surface 32 than distal to the lateral outer surface 32 of the edge region 3. An end surface of the groove 20 distal to the lateral outer surface 32 in the edge region 3 is constructed as a toothed rack profile 21. Grooves 20 may be considered guide elements of the device 1. In one embodiment of the invention, grooves are on each of the outer surfaces 32 of the edge region 3 or, in other words, are formed around the periphery of the edge region (3).

FIG. 2a also illustrates a guide device which engages in the groove 20 proximal to the lateral outer surface 32 of the edge region 3. In the exemplified embodiment represented, the guide device is constructed as a groove block 22. Groove blocks 22 may be used, in particular, for lifting the entire device 1 out of a testing unit, for example.

FIG. 2b illustrates the device according to the invention with a groove 20 shown in FIG. 2a, except a pinion 23 is provided as a guide device which engages in a toothed rack profile 21 constructed on an end surface of the groove 20 distal to a lateral outer surface 32 in an edge region 3 instead of the groove block 22 illustrated in FIG. 2a engaging in the groove 20. Pinions 23 permit the device 1 to travel in the longitudinal direction for the purpose of translatory travel.

Figure 3:
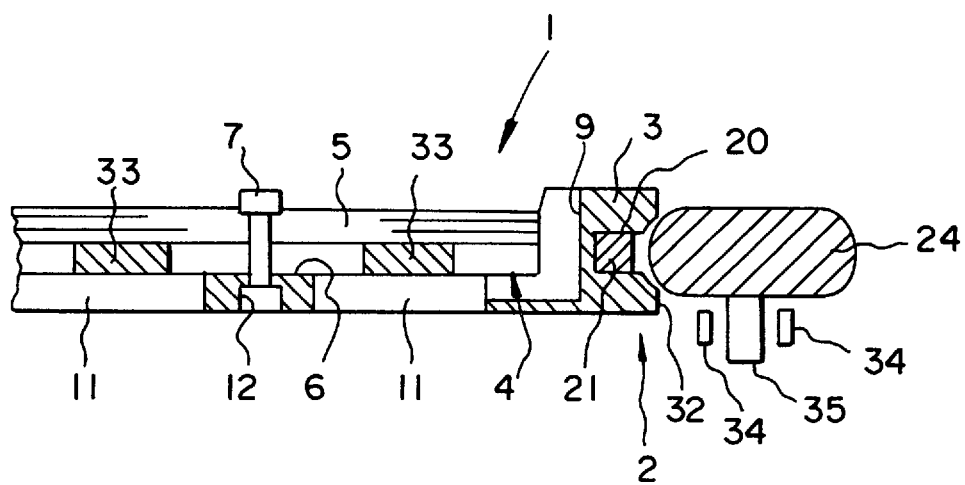
FIG. 3 is a fractional, cross-sectional view of an embodiment of the device with a vertical adjustment device and a conveyer, which is taken along the line II—II of FIG. 1 in the direction of the arrows.

Alternatively, a guide device may be constructed as a roller 24 illustrated in FIG. 3. According to the invention, the guide device includes a shaft 35 and is driven by a conveyer 34 to guide and transport the tray-shaped carrying element 2. The conveyer may be a conveyer belt or a conveyer chain.

Also represented in FIG. 2b is a gripping element 10 which is disposed in the recess 9 and grips under a holding tray 5 held in the holding region 4 of the device 1 according to the invention.

FIG. 3 illustrates the device according to the invention with a vertical adjustment device 33 disposed in the holding region 4 through the use of which a holding tray 5 can be vertically adjusted with respect to a carrying element 2. The vertical adjustment device 33 may be constructed, for example, through the use of pins provided with shoulders, or through the use of insert-type washers or the like.

The device according to the invention is illustrated in FIG. 1–3 holding a tray 5, which has particular dimensions and which holds and transports electronic components, in the holding region 4 of the device 1. (The tray 5 is illustrated in FIG. 1 with broken lines for clarity.) The tray 5 may be simply inserted onto the contact surface 6 of the holding region 4 of the device 1. The openings 11 and also the recesses 9 simplify and facilitate inserting the tray 5 on the contact surface 6, since the tray 5 is more easily gripped as a result. In addition to manual insertion and removal of the tray 5, automated handling of the tray 5 is also possible, for example through use of the gripping element 10 illustrated in FIG. 2b.

After the tray 5 is inserted onto the contact surface 6, the locking pins 7a and 7b are displaced in the guides 12 to the edge of the tray 5, where they are locked. The locking pins 7a and 7b snap-in to lock in position. A further possibility is to provide the locking pins 7a and 7b with a spring-loading system, which retains them in the position selected or presses them against the edge of the tray 5. Due to the locking pins 7a and 7b, which are displaced to the edge of the tray 5, the tray 5 fits exactly and tightly in the holding region 4 of the device 1. The edges of the holding tray 5 define the dimensions of the holding tray 5. As a result, the holding region 4 may be viewed as having variable dimensions for adapting to the dimensions of the holding tray 5. In this way, the tray 5 may be transported, in the device 1, through a testing unit for example. Due to the position, which is defined through the use of the locking pins 7a and 7b, of the tray 5 in the device 1, automated testing of the electronic components disposed in the tray is possible.

In the example illustrated in FIGS. 1, the width of the tray 5 disposed on the holding region 4 of the device 1 corresponds exactly to the width of the holding region 4. The tray 5, thus, abuts directly against the two longitudinal inner sides 31 of the edge region 3. Therefore, only locking pins 7a, which are displaceable in the longitudinal direction of the holding region 4, are displaced in guides 12 up to the edge of the tray 5. The locking pins 7b, which are displaceable transversely to the holding region 4, are pushed entirely out of the holding region 4 and into recesses 8 provided for holding them, so that the entire width of the holding region 4 is available for inserting a tray.

If a narrower tray 5 is inserted in the device 1, the tray is disposed with two sides abutting the two inner sides 31 of the edge region 3 distal to the two inner sides 31 of the edge region 3 with recesses 8 and guides 12. The locking pins 7a and 7b are then displaced in the guides 12, in a corresponding manner, to the edge of the tray 5 to hold the tray 5 in the holding region 4 of the device 1.

The illustration of FIG. 1 is merely diagrammatic. It is naturally possible to provide additional guides 12, with locking pins 7a and 7b, than are represented in FIG. 1. It is also entirely possible to hold a plurality of trays in the device according to the invention. The number of trays which may be held in the device 1 depends upon the dimensions of the holding region 4 and the trays 5. Should more locking pins 7a and 7b be required to hold a plurality of trays, it is also possible to easily insert additional locking pins 7a and 7b afterwards and, if they are no longer needed, to remove them again just as easily.

I claim:

1. A device for holding at least one holding tray for electronic components, comprising:

a tray-shaped carrying element, said carrying element including a holding region for receiving at least one holding tray, said holding region having variable dimensions to be adapted to dimensions of the at least one holding tray, and said carrying element including a rectangular-shaped edge region having outer surfaces with guide elements and a periphery, said guide elements being grooves formed around said periphery of said edge region wherein said grooves have a cross section widening towards said outer surface and an end surface with a toothed rack profile for assisting in guiding said tray-shaped carrying element.

2. The device according to claim 1, wherein said holding region of said carrying element holds at least one non-standardized holding tray.

3. The device according to claim 1, wherein said holding region includes a contact surface and locking pins disposed in said contact surface for displacement to the dimensions of the at least one holding tray.

4. The device according to claim 3, wherein said locking pins are displaceable longitudinally and transversely to said holding region.

5. The device according to claim 3, wherein said locking pins lock in a position.

6. The device according to claim 5, wherein said locking pins are snap-in locking pins.

7. The device according to claim 5, wherein said locking pins are spring-loaded.

8. The device according to claim 2, wherein said edge region has inner sides with recesses formed therein.

9. The device according to claim 8, wherein said locking pins displace in said recesses for complete displacement from said holding region.

10. The device according to claim 8, including gripping elements disposed in said recesses for gripping underneath the at least one tray inserted in said holding region.

11. The device according to claim 1, including a vertical adjustment device disposed in said holding region for vertically adjusting the at least one holding tray in said carrying element.

12. The device according to claim 3, wherein said contact surface of said holding region has at least one depression formed therein.

13. The device according to claim 3, wherein said contact surface of said holding region has at least one opening.

14. The device according to claim 1, including guide devices for engaging in said guide elements on said carrying element.

15. The device according to claim 14, wherein said guide devices are groove blocks.

16. The device according to claim 14, wherein said guide devices are pinions.

17. The device according to claim 14, wherein said guide devices are rollers.

18. A device for holding at least one holding tray for electronic components, comprising:

a tray-shaped carrying element, said carrying element including a holding region for receiving at least one holding tray, said holding region having variable dimensions to be adapted to dimensions of the at least one holding tray, said carrying element including a rectangular-shaped edge region having outer surfaces with guide elements, and guide devices for engaging in said guide elements on said carrying element, wherein said guide devices being driven by conveyor belts to guide and transport said tray-shaped carrying element.

19. A device for holding at least one holding tray for electronic components, comprising:

a tray-shaped carrying element, said carrying element including a holding region for receiving at least one holding tray, said holding region having variable dimensions to be adapted to dimensions of the at least one holding tray, said carrying element including a rectangular-shaped edge region having outer surfaces with guide elements, and guide devices for engaging in said guide elements on said carrying element, wherein said guide devices being driven by conveyor chains to guide and transport said tray-shaped carrying element.

20. The device according to claim 1, wherein said tray-shaped carrying element is plastic.

21. The device according to claim 1, wherein said tray-shaped carrying element is made of a light metal.

22. The device according to claim 21, wherein said tray-shaped carrying element is aluminum.

* * * * *